United States Patent
Kobayashi

[11] Patent Number: 6,052,170
[45] Date of Patent: Apr. 18, 2000

[54] INSPECTABLE LIQUID-CRYSTAL DISPLAY PANEL AND METHOD OF INSPECTING SAME

[75] Inventor: Yoshifumi Kobayashi, Hotaka-machi, Japan

[73] Assignee: Seiko Epson Corporation, Japan

[21] Appl. No.: 09/076,464

[22] Filed: May 12, 1998

[30] Foreign Application Priority Data

May 13, 1997 [JP] Japan ..................................... 9-122708
Feb. 24, 1998 [JP] Japan ................................. 10-042567

[51] Int. Cl.[7] .............................. G02F 1/1345; G02F 1/13
[52] U.S. Cl. ......................... 349/149; 349/150; 349/152; 349/192
[58] Field of Search .................................... 349/149, 152, 349/192, 150

[56] References Cited

U.S. PATENT DOCUMENTS

| | | | |
|---|---|---|---|
| 5,016,986 | 5/1991 | Kawashima et al. | 350/339 |
| 5,402,255 | 3/1995 | Nakanishi et al. | 349/150 |
| 5,467,210 | 11/1995 | Kishigami | 349/150 |
| 5,572,346 | 11/1996 | Sakamoto et al. | 359/88 |
| 5,608,559 | 3/1997 | Inada et al. | 349/149 |
| 5,680,191 | 10/1997 | Voisin et al. | 349/150 |
| 5,689,352 | 11/1997 | Kishigami | 359/88 |
| 5,712,493 | 1/1998 | Mori et al. | 349/152 |
| 5,713,563 | 2/1998 | Chan | 269/21 |
| 5,737,053 | 4/1998 | Yomogihara et al. | 349/149 |
| 5,745,202 | 4/1998 | Yamauchi et al. | 349/149 |
| 5,818,562 | 10/1998 | Yoon | 349/149 |

*Primary Examiner*—William L. Sikes
*Assistant Examiner*—Tarifur Chowdhury
*Attorney, Agent, or Firm*—Harness, Dickey & Pierce, P.L.C.

[57] ABSTRACT

A liquid-crystal display panel 20 comprises a first substrate 30 having an IC chip 60 mounted on the margin thereof and a second substrate 50 opposed to the first substrate 30 except the margin 31 on which the IC chip 60 is mounted. The first substrate 30 has two rows of pads 33 and 34, which are used to attach the IC chip 60, arranged nearly parallel to a side of the second substrate 50 adjoining the margin 31 on the margin 31 on which the IC chip 60 is mounted. A wiring pattern of lines passing through the pads on the row of pads 33 near the adjoining side of the second substrate 50 out of the rows of pads 33 and 34 includes a straight wiring-pattern part 38 extended straight to the inside of an IC chip mounting region 40 or a region in which the IC chip 60 is mounted. As such, a liquid-crystal display panel is provided which is capable of being tested for lighting prior to mounting of an IC chip even though a wiring pattern surrounding the IC chip on a liquid-crystal substrate is very short.

12 Claims, 8 Drawing Sheets

INSPECTABLE LIQUID-CRYSTAL DISPLAY PANEL AND METHOD OF INSPECTING SAME

BACKGROUND OF THE INVENTION

1. Field of the Invention

The present invention relates to a liquid-crystal display panel and a method of inspecting a liquid-crystal display panel. More particularly, this invention is concerned with a liquid-crystal display panel capable of being inspected for lighting prior to mounting of an IC chip without the necessity of enlarging a portion of the liquid-crystal display panel outside a display region, and a method of inspecting a liquid-crystal display panel.

2. Discussion

In the field of equipment using liquid-crystal display panels, there is a demand for obtaining as large an area of display as possible by minimizing a region outside a display region of a liquid-crystal display panel, within the limited size of an equipment having the liquid-crystal panel mounted thereon.

On the other hand, there is a demand for making a volume occupied by a liquid-crystal display panel and circuits for driving the liquid-crystal display panel as small as possible so as to realize a thin and lightweight equipment in which the liquid-crystal display panel is employed. A chip-on-glass (COG) substrate having an IC chip, which includes drive circuits or the like, mounted on the margin thereof is widely applied for a substrate used to form a liquid-crystal display panel.

For applying the COG substrate having an IC chip, used for drive circuits of the like, mounted on the margin thereof for a substrate for forming a liquid-crystal display panel, and for making the margin mounted with the IC chip, which is a non-display region, as small as possible, a wiring pattern surrounding the IC chip is designed to have a minimum length.

However, as far as this kind of liquid-crystal display panel is concerned, since the wiring pattern surrounding the IC chip is too short, when contact terminals of an inspection instrument used to inspect a liquid-crystal display panel for lighting prior to mounting of an IC chip are brought into contact with lines constituting the writing pattern for the purpose of lighting inspection, sufficient electrical contact cannot be attained. This causes a problem that the lighting inspection becomes hard to do.

The present invention attempts to solve the above problem. An object of the present invention is to provide a liquid-crystal display panel capable of being inspected for lighting prior to mounting of an IC chip even when a wiring pattern surrounding the IC chip on a liquid-crystal substrate is very short, and a method of inspecting a liquid-crystal display panel.

SUMMARY OF THE INVENTION

According to the claim 1 of the present invention, the liquid-crystal display panel comprises a first substrate having an IC chip mounted on the margin thereof, and a second substrate opposed to the first substrate except the margin on which the IC chip is mounted. The liquid-crystal display panel is characterized in that: the first substrate has two rows of pads, which are used to attach the IC chip, arranged nearly parallel to a side of the second substrate adjoining the margin on the margin on which the IC chip is mounted; and a wiring pattern of lines passing through the pads on the row of the adjoining side of the second substrate includes a straight wiring-pattern part extending straight to the inside of an IC chip mounting region or a region on which the IC chip is mounted.

According to the claim 1 of the present invention, the first substrate that is one of two substrates of the liquid-crystal display panel has the pads, which are used to attach the IC chip, formed on the margin thereof not opposed to the second substrate that is the other substrate. A straight wiring pattern of lines passing through the pads on the row of pads parallel to the adjoining side of the second substrate and near the second substrate is extended straight to a position inside a region to be occupied by the IC chip when the IC chip is mounted, and thus is formed as the straight wiring-pattern part. When the liquid-crystal display panel is tested for lighting prior to mounting of the IC chip, a contact connector for inspection is brought into contact with the straight wiring-pattern part. Thus, sufficient electrical contact can be attained, and a driving signal for driving the liquid-crystal display panel can be supplied through the contact connector for inspection. Even though the portion of the wiring pattern which connects the row of pads near the second substrate and is not hidden behind the second substrate, is very short, the liquid-crystal display panel can be tested for lighting prior to mounting of the IC chip.

According to the claim 2 of the present invention, the liquid-crystal display panel comprises a first substrate having an IC chip mounted on the margin thereof, and a second substrate opposed to the first substrate except the margin on which the IC chip is mounted. The liquid-crystal display panel is characterized in that: the first substrate has two rows of pads, which are used to attach the IC chip, arranged nearly parallel to a side of the second substrate adjoining the margin on the margin on which the IC chip is mounted; and each pad on the row of the adjoining side of the second substrate is formed with a straight wiring-pattern part that is a longer straight wiring pattern than a straight wiring pattern provided as parts of the pads on the row far away from the adjoining side.

According to the claim 2 of the present invention, the first substrate that is one of two substrates of the liquid-crystal display panel has the pads, which are used to attach the IC chip, formed on the margin thereof not opposed to the second substrate that is the other substrate. The straight wiring pattern passing through the pads on the row of pads parallel to the adjoining side of the second substrate and near the second substrate is extended longer than the straight wiring pattern passing through the pads on the opposed row of pads, and is formed as the straight wiring-pattern part. When the liquid-crystal display panel is tested for lighting prior to mounting of the IC chip, a contact connector for inspection is brought into contact with the straight wiring-pattern part. Thus, sufficient electrical contact can be attained, and a driving signal for driving the liquid-crystal display panel can be supplied through the contact connector for inspection. Even though the portion of the wiring pattern connecting the row of pads near the second substrate, which is not hidden behind the second substrate, is very short, the liquid-crystal display panel can be tested for lighting prior to mounting of the IC chip.

According to the claim 3 of the present invention, the liquid-crystal display panel comprises a first substrate having an IC chip mounted on the margin thereof, and a second substrate opposed to the first substrate except the margin on which the IC chip is mounted, and that is inspected for lighting prior to mounting of the IC chip. The liquid-crystal display panel is characterized in that: the first substrate has two rows of pads, which are used to attach the IC chip, arranged nearly parallel to a side of the second substrate adjoining the margin on the margin on which the IC chip is mounted; and a writing pattern passing through the pads on the row of the adjoining side of the second substrate includes a straight wiring-pattern part that extends straight to the inside of a region on which the IC chip is mounted and that has a length corresponding to the length of contact terminals of a contact connector for inspection.

According to the claim 3 of the present invention, the first substrate that is one of two substrates of the liquid-crystal display panel has the pads, which are used to attach the IC chip, formed on the margin thereof not opposed to the second substrate that is the other substrate. The straight wiring pattern passing through the pads on the row of pads parallel to the adjoining side of the second substrate and near the second substrate is extended to the inside of the region on which the IC chip is mounted, and is formed as the straight wiring-pattern part. The straight wiring-pattern part has a length permitting sufficient electrical contact by bringing into contact with the contact connector for inspection which is used to test the liquid-crystal panel display for lighting prior to mounting of the IC chip. A driving signal for driving the liquid-crystal display panel can be supplied through the contact connector for inspection. Even though the portion of the wiring pattern connecting the row of pads near the second substrate, which is not hidden behind the second substrate, is very short, the liquid-crystal display panel can be tested for lighting prior to mounting of the IC chip.

According to the claim 4 of the present invention, a liquid-crystal display panel in accordance with any of the claim 1 to 3 is characterized that the IC chip and first substrate are adhered to each other using an insulating adhesive outside the area of the pads within the region on which the IC chip is mounted.

According to the claim 4 of the present invention, the IC chip and first substrate are adhered to each other using the insulating adhesive except the area of the pads. The IC chip can therefore be fixed to the substrate reliably. And also, the straight wiring-pattern part extended to a position opposed to the bottom of the IC chip and the bottom of the IC chip can be reliably isolated from each other.

According to the claim 5 of the present invention, the method of inspecting a liquid-crystal display panel is a method of inspecting a liquid-crystal display panel in accordance with any of the claim 1 to 4. The method of inspecting a liquid-crystal display panel is characterized by having a step of bringing the contact terminals corresponding to the contact connector for inspection into contact with a plurality of the straight wiring-pattern parts.

According to the claim 5 of the present invention, the contact connector for inspection is brought into contact with the straight wiring-pattern part having a length permitting sufficient electrical contact with the contact connector for inspection for the purpose of inspecting the liquid-crystal display panel. The liquid-crystal display panel can therefore be inspected highly reliably.

BRIEF DESCRIPTION OF THE DRAWINGS

In order to appreciate the manner in which the advantages and objects of the invention are obtained, a more particular description of the invention will be rendered by reference to specific embodiments thereof which are illustrated in the appended drawings. Understanding that these drawings only depict preferred embodiments of the present invention and are not therefore to be considered limiting in scope, the invention will be described and explained with additional specificity and detail through the use of the accompanying drawings in which.

DETAILED DESCRIPTION OF THE PREFERRED EMBODIMENTS

Figure 1:
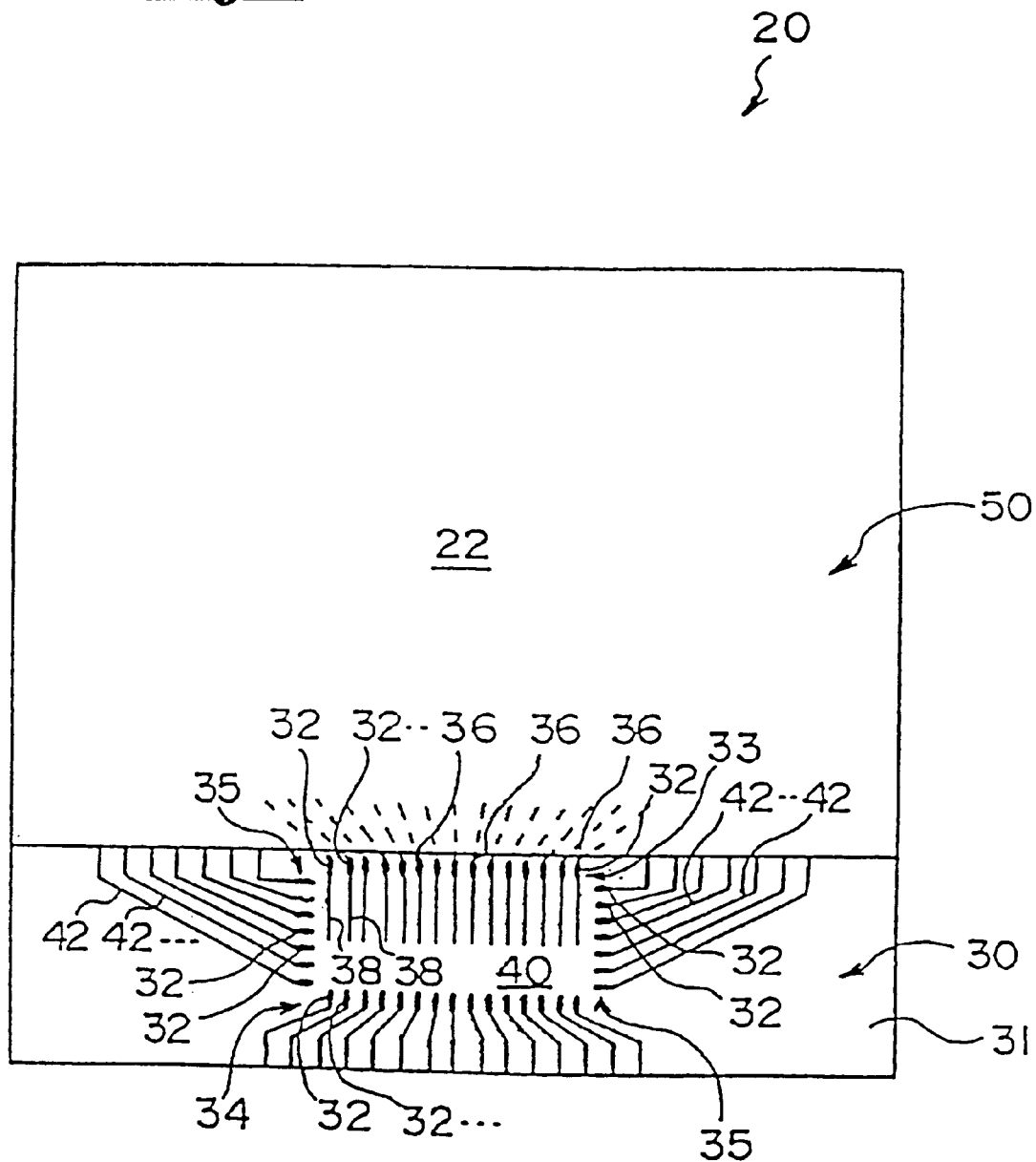
FIG. 1 is a typical plan view showing a liquid-crystal display panel of an embodiment having no IC chip mounted thereon.

Referring to the drawings, a preferred embodiment of the present invention will be explained in more detail.

Figure 2:
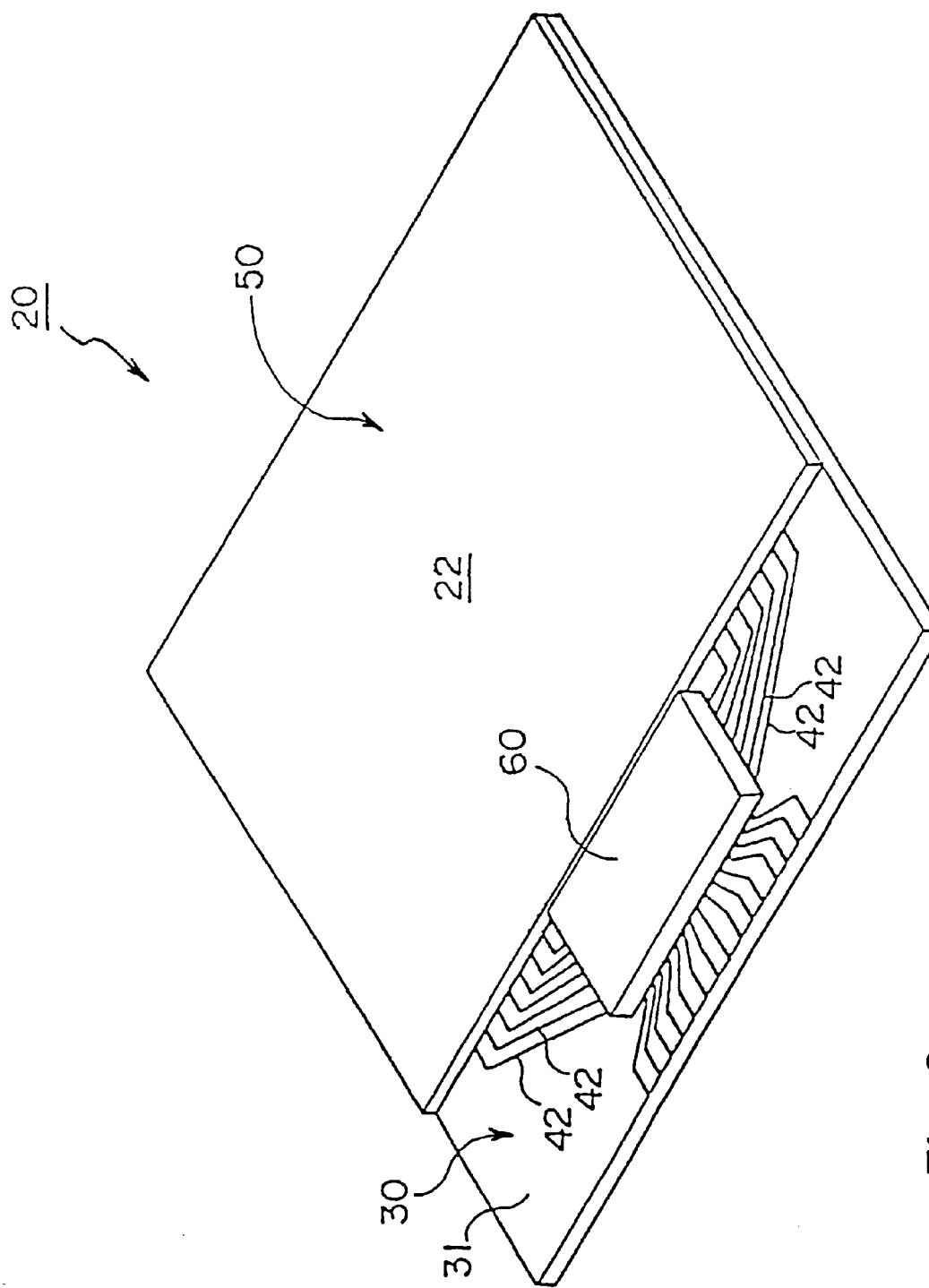
FIG. 2 is a typical oblique view showing the liquid-crystal display panel of the embodiment.

FIG. 1 is a typical plan view showing a liquid-crystal display panel 20 of an embodiment having no IC chip mounted thereon. The liquid-crystal display panel 20 of this embodiment is a super-twisted nematic (STN) simple matrix liquid-crystal display panel 20 comprising a first substrate 30 that has an IC chip 60 (see FIG. 2) mountable on a margin 31 thereof, and a second substrate 50 that is smaller than the first substrate 30 by the size of the margin 31 on which the IC chip is mounted. The second substrate 50 is opposed to the first substrate 30 except the margin of the first substrate 31 on which the IC chip 60 is mounted.

The first substrate 30 is provided with pads 32, for connecting to bumps 62 (see FIG. 3) of the IC chip on the margin 31 not opposed to the second substrate 50, and wiring patterns 36 and 42 of lines extending from the pads 32. The pads 32 are arranged in rows along the margin 31 of the IC chip 60. Among the pads, two rows of pads 33 and 34 are nearly parallel to a side of the second substrate 50 adjoining the margin. The wiring pattern passing through the pads 32 of the row 33 near the adjoining side of the second substrate 50 out of the two rows 33 and 34 is, as shown in FIG. 1, extending straight to the inside of an IC chip mounting region 40 that is a region to be occupied by the IC chip 60 when the IC chip is mounted on the substrate, and is thus formed as a straight wiring-pattern part 38 reaching a position beyond a center line of the IC chip mounting region 40. The straight wiring-pattern part 38 extends straight to the inside of the IC chip mounting region 40 and has nearly the same length as the length of contact terminals 84 in a center area 85 corresponding to the straight wiring pattern 38 of a contact connector for inspection 80, which will be described later in the oblique view of FIG. 5 and the bottom view of FIG. 6. The straight wiring-pattern part 38 is a longer straight wiring pattern than a straight wiring pattern extending from the pads 32 of the opposed row 34.

Since the straight wiring-pattern part 38 has a sufficient length, when the liquid-crystal display panel 20 is tested for lighting prior to mounting of the IC chip 60, sufficient electrical contact can be attained in the contact terminals 84 in the center area 85 provided in the contact connector for inspection 80 attached to the straight wiring-pattern part 38. Consequently, even though the portion of the wiring pattern between a display region 22 of the liquid-crystal display panel 20 and the row of pads 33 near the second substrate 30, which is not hidden behind the second substrate 50, is very short, as shown in this embodiment, a driving signal can be supplied to the liquid-crystal display panel 20 through the contact terminals 84 in the center area 85 provided in the contact connector for inspection 80. Thus, the liquid-crystal display panel 20 can be tested for lighting prior to mounting of the IC chip 60.

The liquid-crystal display panel 20 of this embodiment is inspected for lighting using the contact connector for inspection 80 that is attached to the straight wiring-pattern part 38 in order to attain electrical contact. Thereafter, as shown in the typical oblique view of FIG. 2, the IC chip 60 is mounted in the IC chip mounting region 40 on the margin 31 of the first substrate 30. Thus, a finished product is provided.

Figure 3:
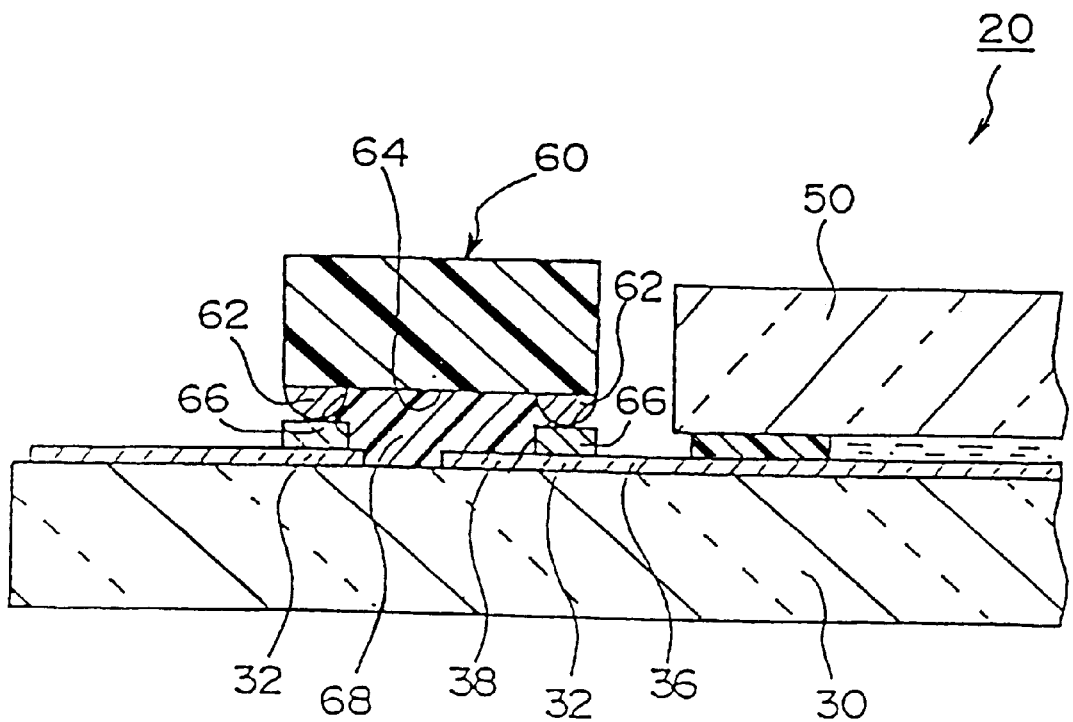
FIG. 3 is a typical sectional view showing an IC chip and its surroundings on the liquid-crystal display panel of the embodiment.

Prior to mounting of the IC chip 60, as shown in the typical sectional view of FIG. 3, an anisotropic conductive-material layer 66 is formed on the first substrate 30 in an area consisting of the rows of pads 33, 34, and 35 used to attach the IC chip 60. An insulating adhesive layer 68 is formed in an area other than the area of the rows of pads 33, 34, and 35 within the IC chip mounting region 40. The bumps 62 of the IC chip 60 are therefore electrically connected to the pads 32 on the first substrate 30 via the anisotropic conductive-material layer 66. In FIG. 3, a polarizing plate, reflector, and the like are not shown. The IC chip mounting region 40 containing the straight wiring-pattern part 38 on the first substrate 30 is adhered to the bottom of the IC chip 60 via the insulating adhesive layer 68 except the area of the rows of pads 33, 34, and 35.

The IC chip 60 can therefore be reliably fixed to the first substrate 30. Moreover, the straight wiring-pattern part 38 extended to a position opposed to the bottom of the IC chip 30 and the bottom of the IC chip 60 can be isolated from each other reliably.

Now, a method of inspecting the liquid-crystal display panel 20 for lighting prior to mounting of the IC chip will be described.

Figure 4:
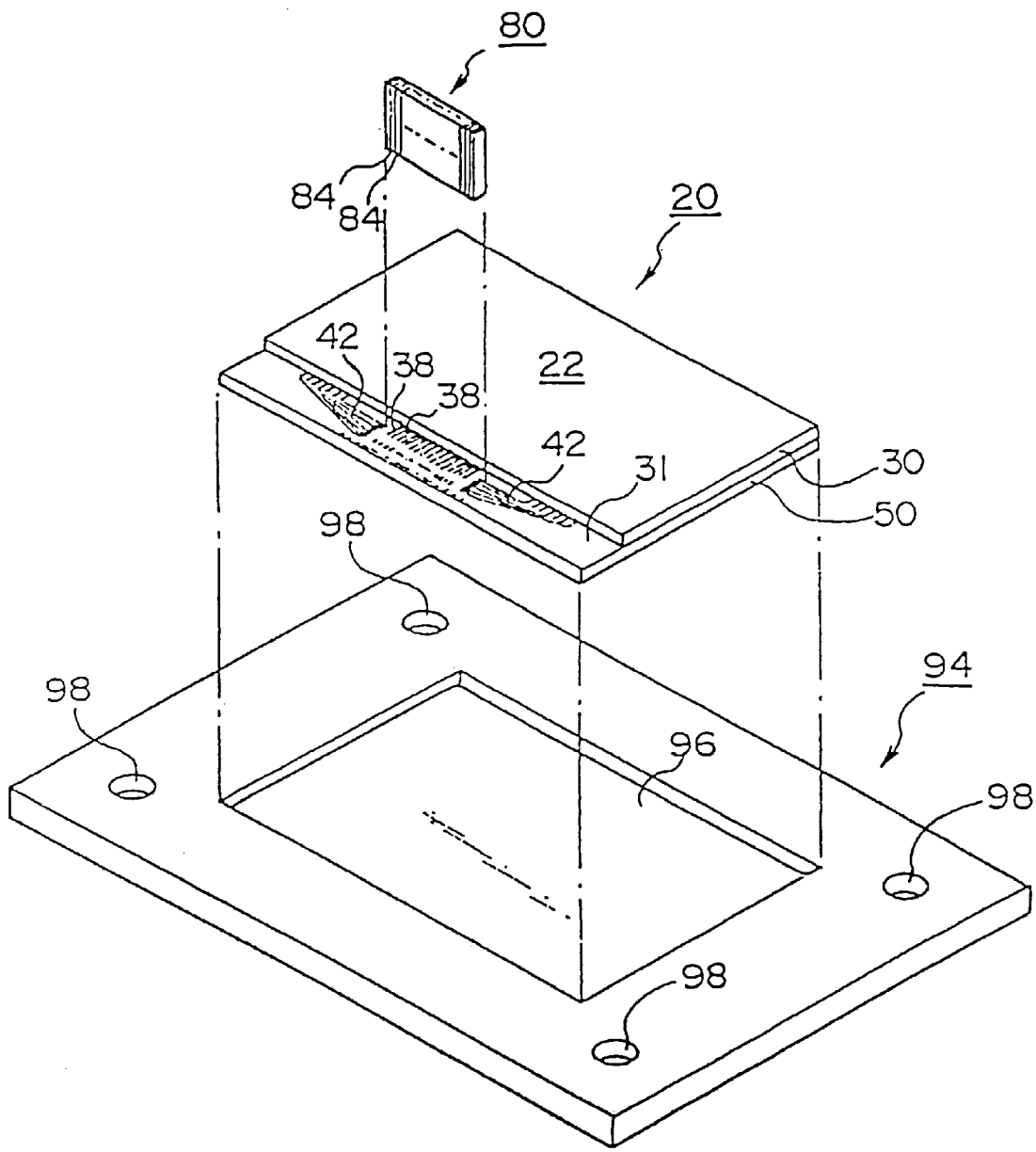
FIG. 4 is an oblique view showing the positional relationship among a liquid-crystal panel holding plate of an inspection instrument, a liquid-crystal display panel, and a contact connector for inspection.

First, as shown in the oblique view of FIG. 4, the liquid-crystal display panel 20 is fitted into a concave part 96 of a liquid-crystal panel holding plate 94 that is part of an inspection instrument and made of an acrylic. According to this embodiment, for carrying out lighting inspection, the contact terminals 84 located on one surface of the contact connector for inspection 80 shown in FIG. 4 are attached to the positioned liquid-crystal display panel 20 to be brought into contact with the straight wiring-pattern part 38 of the liquid-crystal display panel 20, and thus driven to conduction relative to a printed-circuit board 86, connected to the contact connector for inspection 80, which will be described later. The inspection is then carried out.

Figure 5:
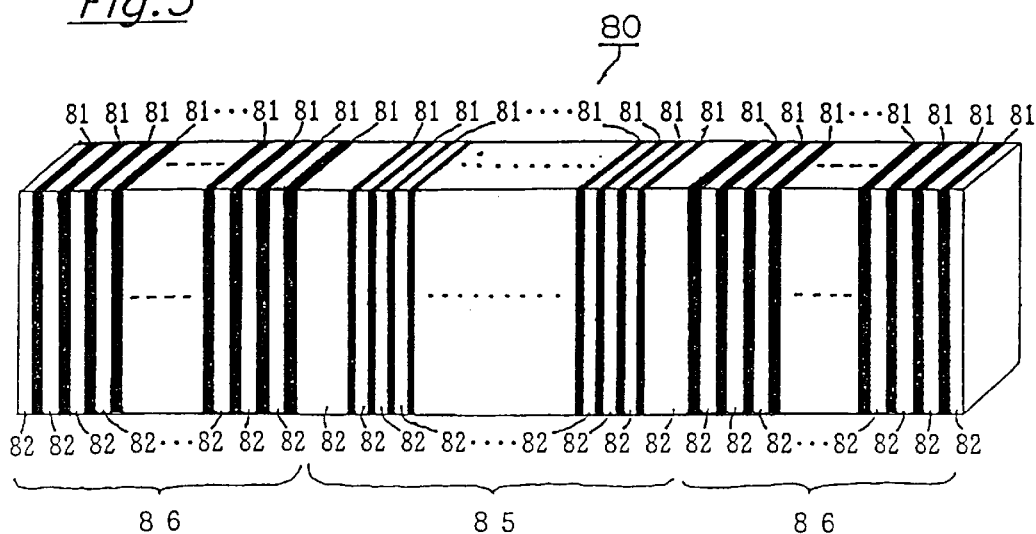
FIG. 5 is a typical oblique view showing the contact connector for inspection.
Figure 6:
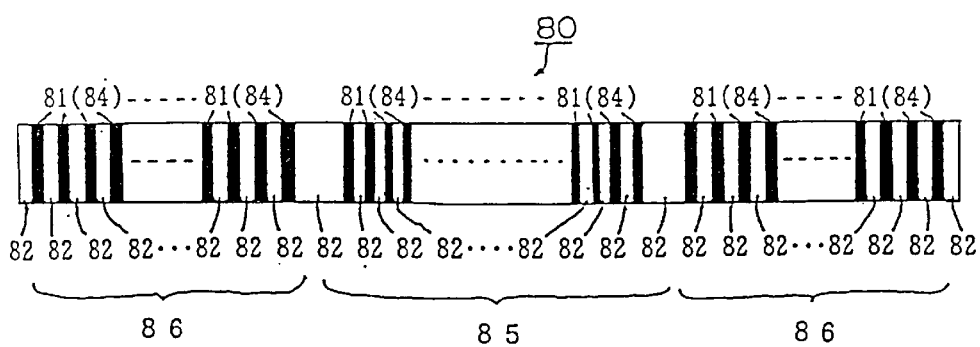
FIG. 6 is a typical bottom view showing the contact connector for inspection.
Figure 7:
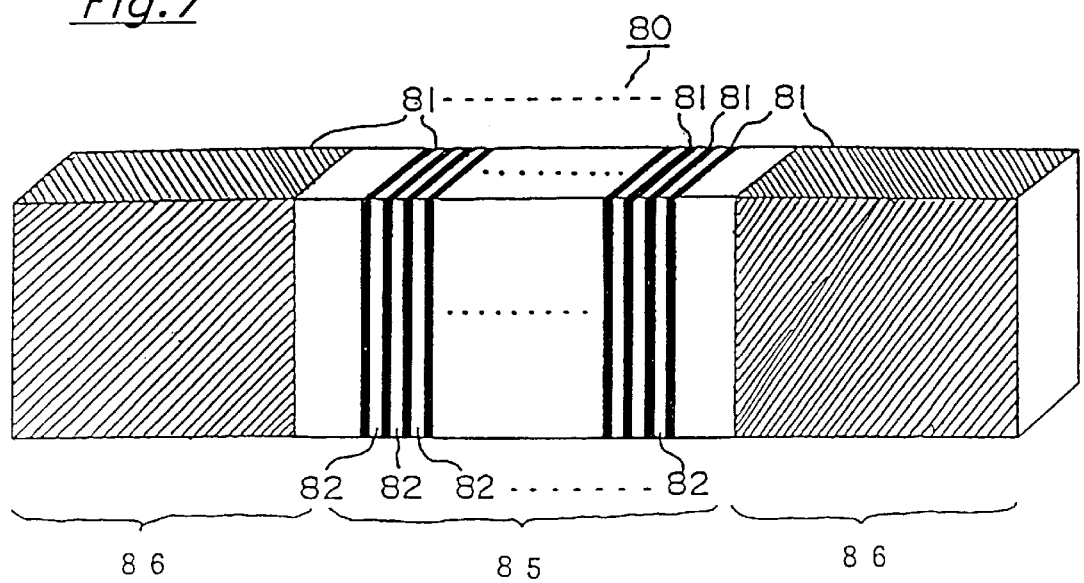
FIG. 7 is another typical oblique view showing the contact connector for inspection.
Figure 8:
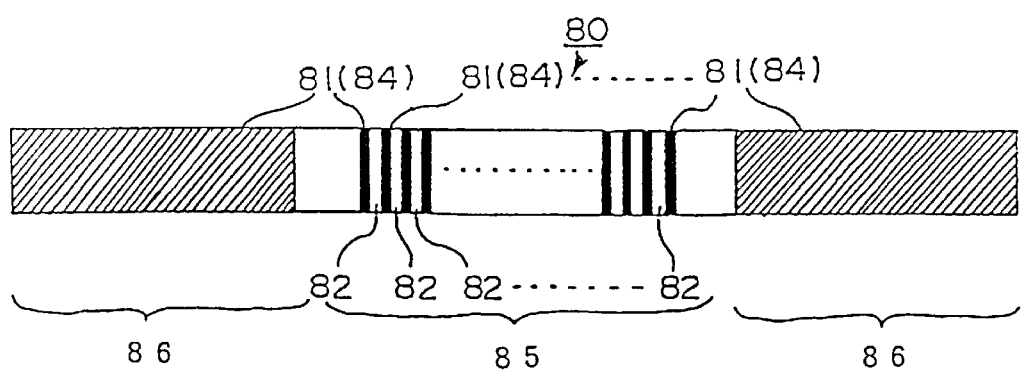
FIG. 8 is another typical bottom view showing the contact connector for inspection.

The contact connector for inspection 80 has, as shown in the oblique view of FIG. 5, insulating elastic members 82 made of a rubber, silicon, or the like, and metallic members 81 made of copper, aluminum, or the like, which are arranged alternately in zebra shape (lines and reference numerals are omitted from the dotted portions of FIG. 5). FIG. 6 is a bottom view of the contact connector for inspection 80. The contact connector for inspection 80 has the metallic members 81 and elastic members 82 located alternately even on the bottom thereof (lines and reference numerals are omitted from the dotted portions of FIG. 6). The metallic members 81 located on the bottom of the contact connector for inspection 80 act as the contact terminals 84, and are, if necessary, gold-plated.

Figure 9:
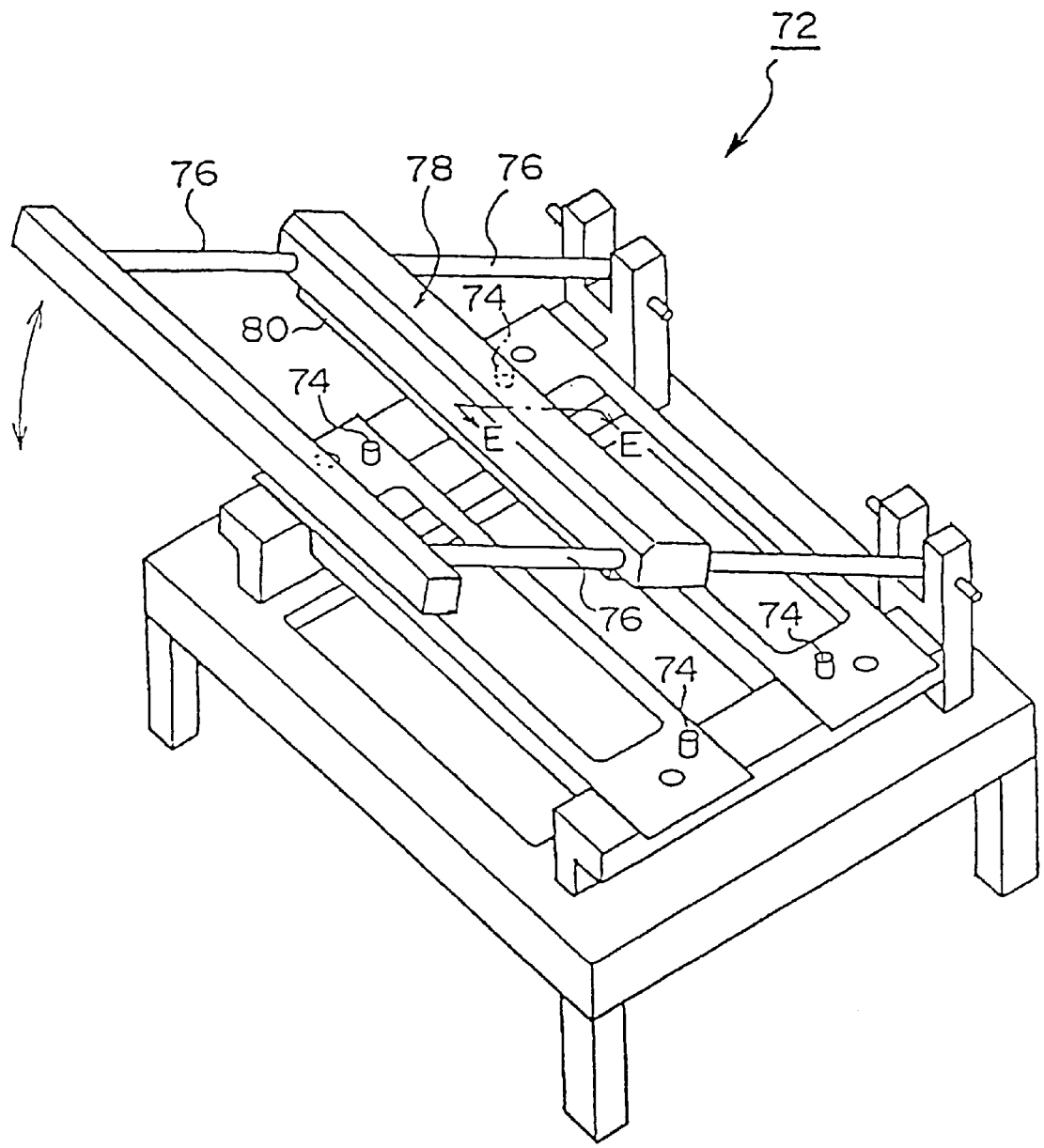
FIG. 9 is a typical oblique view showing a main inspection-instrument unit.

As shown in FIG. 4, the liquid-crystal display panel 20 positioned on the liquid-crystal panel holding plate 94 is locked in a main inspection-instrument unit 72 shown in FIG. 9 together with the liquid-crystal panel holding plate, and then inspected. Specifically, openings 94 formed at four corners of the liquid-crystal panel holding plate 94 having the concave part 96 into which the liquid-crystal display panel 20 is fitted are engaged with four convex parts 74 of the main inspection-instrument unit 72. Thus, the liquid-crystal holding plate 94 is fixed on the main inspection-instrument unit 72.

Figure 10:
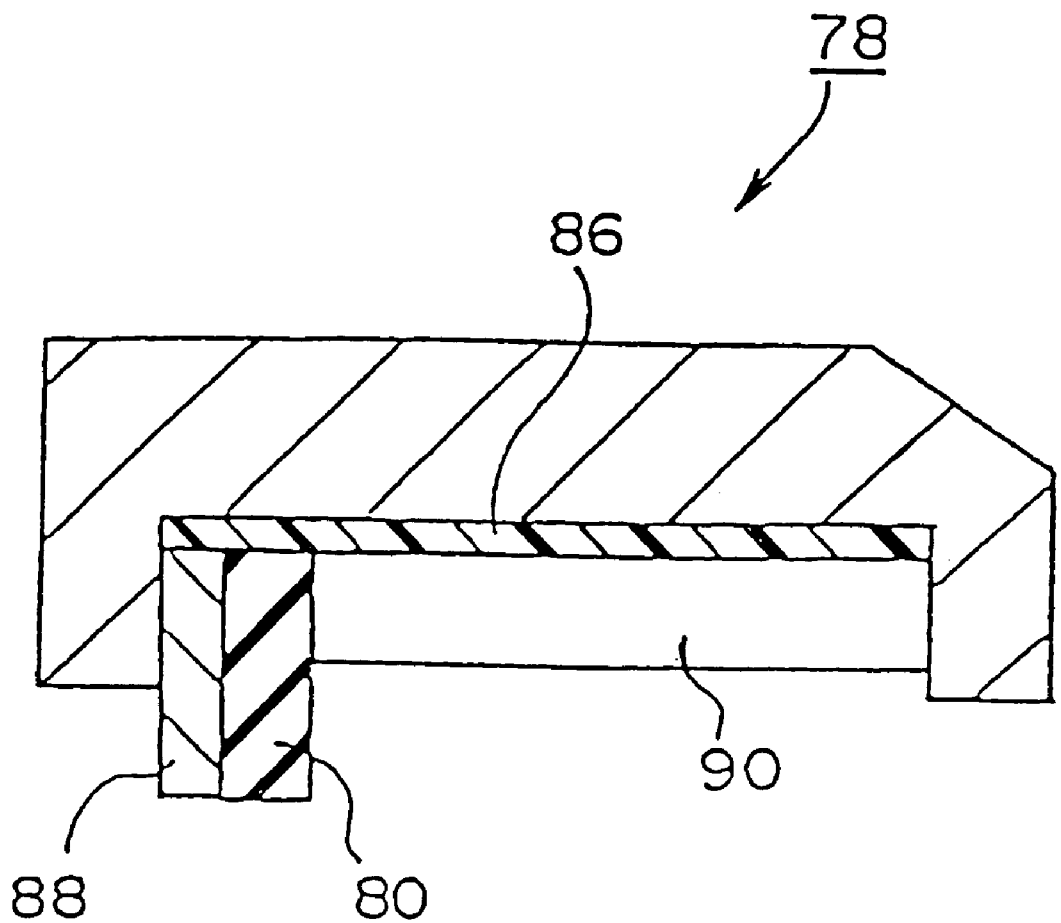
FIG. 10 is a typical sectional view showing an inspector of an inspection instrument along the E—E line shown in FIG. 7.

The main inspection-instrument unit 72 shown in FIG. 9 has an inspector 78 which fits the arms 76 that are movable towards the locked liquid-crystal display panel 20 with the contact connector for inspection 80. FIG. 10 is a sectional view of the inspector 78 on the E—E line shown in FIG. 9. As shown in the drawing, the inspector 78 has a reinforcement member 88 and presser member 90 located on the front and the rear of the contact connector for inspection 80. With the contact connector for inspection 80 between to lock the reinforcement member 88 and presser member 90. One end of the contact connector for inspection 80 is jutting downward so as to come into contact with the straight wiring-pattern part 38 of the liquid-crystal display panel 20 as shown in FIG. 4. The other end of the contact connector for inspection 80 is in contact with a terminal portion (not shown) of the printed-circuit board 86 located on a deep part in the inspector 78. The terminals of the printed-circuit board 87 and the corresponding metallic members 81 of the contact connector for inspection 80 are thus electrically connected with each other.

The arms 76 of the main inspection-instrument unit 72 are pressed down, whereby the contact connector for inspection 80 of the inspector 78 is attached to the margin 31 of the first substrate 30 of the liquid-crystal display panel 20 with a slight pressing force. The straight wiring-pattern parts 38 are then brought into contact with the corresponding contact terminals 84 in the center area 85 of the contact connector for inspection 80. Consequently, the printed-circuit board 86 and liquid-crystal display panel 20 are electrically connected to each other via the contact connector for inspection 80. The liquid-crystal display panel 20 is then fully lit. Lighting inspection is achieved by checking visually or through image recognition whether or not the liquid-crystal display panel 20 is fully lit in this state.

In the inspector 78 of the inspection instrument, as shown in FIGS. 5 and 6, areas 86 for bringing into contact with the wiring patterns 42 linking the pads on the other rows of pads 35, which are used to attach the IC chip 60, and the display region 22 of the liquid-crystal display panel 20 are formed on the contact connector for inspection, and have, like the center area 85, contact terminals 84. When the arms 76 of the main inspection-instrument unit 72 are lowered, the contact terminals 84 in the both sides areas 86 of the contact connector for inspection 80 are brought into contact with the given wiring patterns 42 on the liquid-crystal display panel 20 in the same state as the aforesaid state at the same time when the contact terminals 84 in the center area 85 are brought into contact with the associated lines. The wiring patterns 42 can be designed to have straight parts that are long enough to bring the exposed lines of the wiring patterns 42 into contact with the contact terminals 84 in the both sides areas 86 of the contact connector for inspection 80. It is not especially necessary to extend the wiring patterns 42 to the inside of the IC chip mounting region. Moreover, when the same signal is supplied to the wiring patterns 42 connected to the rows of pads 35 for the IC chip 60 in order to carry out lighting inspection, the contact terminals 84 in the both sides areas 86 of the contact connector 80 for inspection which are brought into contact corresponding to the exposed lines of the wiring patterns 42 may be provided not in zebra shape but in plane (lines and reference numerals are omitted from the dotted portions of the drawings). Moreover, according to this embodiment, the inspection instrument for lighting inspection is designed so that the contact connector for inspection 80 has both the contact terminals 84 in the center area 85 and the contact terminals 84 in the both sides areas 86. Alternatively, independent inspection connectors may be provided for attaching to the liquid-crystal display panel concurrently or separately by lowering the arms 76 of the main inspection-instrument unit 72.

As mentioned above, the liquid-crystal display panel 20 of this embodiment is inspected for lighting prior to mounting of the IC chip 60.

According to the method of inspecting the liquid-crystal display panel 20 of this embodiment, the contact connector for inspection 80 is brought into contact with the straight wiring-pattern part 38 having a length permitting sufficient electrical contact with the contact connector for inspection 80 to inspect the liquid-crystal display panel 20 prior to mounting of the IC chip 60. Consequently, the liquid-crystal display panel 20 can be inspected highly reliably.

Moreover, the liquid-crystal display panel 20 is fitted into the concave part 96 of the liquid-crystal panel holding plate 94, and the liquid-crystal panel holding plate 94 is locked at a given position in the main inspection-instrument unit 72. In this state, the contact connector for inspection 80 incorporated in the inspector 7 attached to the arms 76 of the main inspection-instrument unit 72 is attached to the liquid-crystal display panel 20. Consequently, the contact terminals 84 located in the center area 85 of the contact connector for inspection 80 can be brought into contact with the corresponding straight wiring-pattern part 38 of the liquid-crystal display panel 20 reliably and readily with an accurate positional relationship maintained. Eventually, the liquid-crystal display panel 20 can be inspected for lighting prior to mounting of the IC chip 60 highly reliably and efficiently.

The embodiment of the present invention has been described so far. However, the present invention is not limited to the aforesaid embodiment. Various modifications can be constructed within the gist of the present invention or within the uniform combination of the claims.

For example, in the aforesaid embodiment, an IC chip to be mounted on the first substrate is placed along only one side of the liquid-crystal display panel. The present invention is not limited to this mode. Alternatively, the liquid-crystal display panel may be a liquid-crystal display panel having a first substrate provided with the margin not opposed to a second substrate along a plurality of sides of the second substrate, and can be applied for the case that IC chips are mounted on the margin along the sides of the second substrate. In this case, the same number of contact connectors for inspection as the number of IC chips are needed, and the inspector of the inspection instrument must be designed to correspond to the number of IC chips.

Moreover, in the aforesaid embodiment, the wiring pattern passing through the pads 32 of the row 33 near the second substrate 50 is extended straight to the inside of the IC chip mounting region 40 as the straight wiring-pattern part. However, the present invention is not limited to this mode. The pads of the row 33 near the second substrate 50 may be formed in cross-stitched shape. In this case, a wiring pattern passing through pads on at least one of rows of pads 32 disposed in cross-stitched shape should be extended straight to the inside of the IC chip mounting region 40 as the straight wiring-pattern part.

Furthermore, in the embodiment, the liquid-crystal display panel is a STN simple matrix liquid-crystal display panel. Alternatively, an active matrix liquid-crystal display panel using three-terminal switching elements, represented by the thin-film transistor (TFT) technology, or two-terminal switching elements, represented by the metal-insulator-metal (MIM) technology, can be applied. Furthermore, as far as electro-optical characteristics are concerned, various types of liquid-crystal display panels; that is, the STN type, twisted nematic (TN) type, guest-host type, polymer dispersed type, phase transition type, or ferroelectric type can be applied.

What is claimed is:

1. A liquid-crystal display panel that comprises a first substrate having an IC chip mounted on a margin thereof, and a second substrate opposed to said first substrate except said margin on which said IC chip is mounted, characterized in that:

said first substrate has two rows of pads on said margin on which said IC is mounted, said pads being used to attach said IC chip and being arranged nearly parallel to a side of said second substrate adjoining said margin; and a wiring pattern of lines passing through each pad on the row nearest said adjoining side includes a straight wiring-pattern part terminating at the inside of an IC chip mounting region or a region in which said IC chip is mounted.

2. A liquid-crystal display panel according to claim 1 wherein said IC chip and first substrate are adhered to each other using an insulating adhesive outside the area of said pads within said IC chip mounting region.

3. A method of inspecting a liquid-crystal display panel according to claim 1, characterized in that:

said method includes a step of bringing contact terminals of a contact connector for inspection into contact with a plurality of lines constituting said straight wiring-pattern part.

4. A liquid-crystal display panel that comprises a first substrate having an IC chip mounted on a margin thereof, and a second substrate opposed to said first substrate except said margin on which said IC chip is mounted, characterized in that:

said first substrate has two rows of pads on said margin on which said IC chip is mounted, said pads being used to attach said IC chip and being arranged nearly parallel to a side of said second substrate adjoining said margin; and the pads on the row nearest said adjoining side are provided with a first straight wiring-pattern part extending from said second substrate, the pads on the row far away from the adjoining side are provided with a second straight wiring pattern extending between said pads on the row far away from the adjoining side and an edge of said first substrate, said first straight wiring pattern being longer than said second straight wiring pattern.

5. A liquid-crystal display panel according to claim 4, wherein said IC chip and first substrate are adhered to each other using an insulating adhesive outside the area of said pads within said IC chip mounting region.

6. A method of inspecting a liquid-crystal display panel according to claim 4, characterized in that:

said method includes a step of bringing contact terminals of contact connector for inspection into contact with a plurality of lines constituting said first straight wiring-pattern part.

7. A liquid-crystal display panel that comprises a first substrate having an IC chip mounted on a margin thereof, and a second substrate opposed to said first substrate except said margin on which said IC chip is mounted, and that is inspected for lighting prior to mounting of said IC chip, characterized in that:

said first substrate has two rows of pads on said margin on which said IC chip is mounted, said pads being used to attach said IC chip and being arranged nearly parallel to a side of said second substrate adjoining said margin; and a wiring pattern of lines passing through the pads on the row nearest the adjoining side includes a straight wiring-pattern part extending straight to the inside of an IC chip mounting region and having a length corresponding to a length of contact terminals formed on a contact connector for inspection.

8. A liquid-crystal display panel according to claim 7, wherein said IC chip and first substrate are adhered to each other using an insulating adhesive outside the area of said pads within said IC chip mounting region.

9. A method of inspecting a liquid-crystal display panel according to claim 7, characterized in that:

said method includes a step of bringing contact terminals of the contact connector for inspection into contact with a plurality of lines constituting said straight wiring-pattern part.

10. A liquid crystal display panel arranged for testing prior to attachment of an IC chip, said liquid crystal display panel comprising:

a first substrate;

a second substrate disposed on said first substrate so as to define a margin on said first substrate for mounting said IC chip;

a first row of pads for coupling with said IC chip disposed on said margin adjacent and parallel to an edge of said second substrate adjacent said margin;

a second row of pads for coupling with said IC chip disposed on said margin laterally spaced apart from said first row of pads and parallel thereto; and a wiring pattern passing through said first row of pads, said wiring pattern including a straight wiring pattern part for coupling with an inspection contact connector, said straight wiring pattern part terminating at an IC chip mounting region of said margin.

11. A liquid crystal display panel arranged for testing prior to attachment of an IC chip, said liquid crystal display panel comprising:

a first substrate;

a second substrate disposed on said first substrate so as to define a margin on said first substrate for mounting said IC chip;

a first row of pads for coupling with said IC chip disposed on said margin adjacent and parallel to an edge of said second substrate adjacent said margin;

a second row of pads for coupling with said IC chip disposed on said margin laterally spaced apart from said first row of pads and parallel thereto;

a first straight wiring-pattern part extending from said second substrate and passing through said first row of pads for coupling with an inspection contact connector; and a second straight wiring-pattern part extending between said second row of pads and an edge of said first substrate, said first straight wiring-pattern part being longer than said second straight wiring-pattern part.

12. A liquid crystal display panel arranged for testing prior to attachment of an IC chip, said liquid crystal display panel comprising:

a first substrate;

a second substrate disposed on said first substrate so as to define a margin on said first substrate for mounting said IC chip;

a first row of pads for coupling with said IC chip disposed on said margin adjacent and parallel to an edge of said second substrate adjacent said margin;

a second row of pads for coupling with said IC chip disposed on said margin laterally spaced apart from said first row of pads and parallel thereto; and a wiring pattern passing through said first row of pads, said wiring pattern including a straight wiring pattern part for coupling with an inspection contact connector extending to the center of an IC chip mounting region of said margin and having a length corresponding to a length of contact terminals formed on said inspection contact connector.

* * * * *